United States Patent [19]
Gaarder

[11] Patent Number: 6,153,832
[45] Date of Patent: Nov. 28, 2000

[54] Z-FOLD PRINTHEAD CARRIAGE TRAILING CABLE FOR OPTIMIZED PANELIZATION

[75] Inventor: Glenn Gaarder, Ramona, Calif.

[73] Assignee: Hewlett-Packard Company, Palo Alto, Calif.

[21] Appl. No.: 09/247,753

[22] Filed: Feb. 8, 1999

[51] Int. Cl.[7] .................................................. H05K 1/02
[52] U.S. Cl. ..................... 174/254; 174/117 F; 361/749
[58] Field of Search ................... 174/68.1, 72 A, 174/72 R, 254, 117 F; 361/749, 750, 751

[56]  References Cited

U.S. PATENT DOCUMENTS

| | | | |
|---|---|---|---|
| 4,659,872 | 4/1987 | Dery et al. | 174/117 A |
| 5,130,499 | 7/1992 | Dijkshoorn | 174/254 |
| 5,250,758 | 10/1993 | Fjelstad et al. | 174/72 A |
| 5,760,997 | 6/1998 | Koyanagi et al. | 174/254 |
| 5,917,158 | 6/1999 | Takao et al. | 174/254 |
| 6,020,559 | 2/2000 | Maeda | 174/117 F |

*Primary Examiner*—Dean A. Reichard
*Assistant Examiner*—Adolfo Nino

[57] ABSTRACT

An insulated substantially flat multi-conductor flexible printhead carriage trailing cable fabricated as a unit for conducting de-multiplexed electrical printhead control signals to inkjet printheads mounted on a moveable carriage is provided with a longitudinally extending cut and Z-fold at the carriage end for efficient fabrication of a plurality of units from a single manufacturing panel.

12 Claims, 6 Drawing Sheets

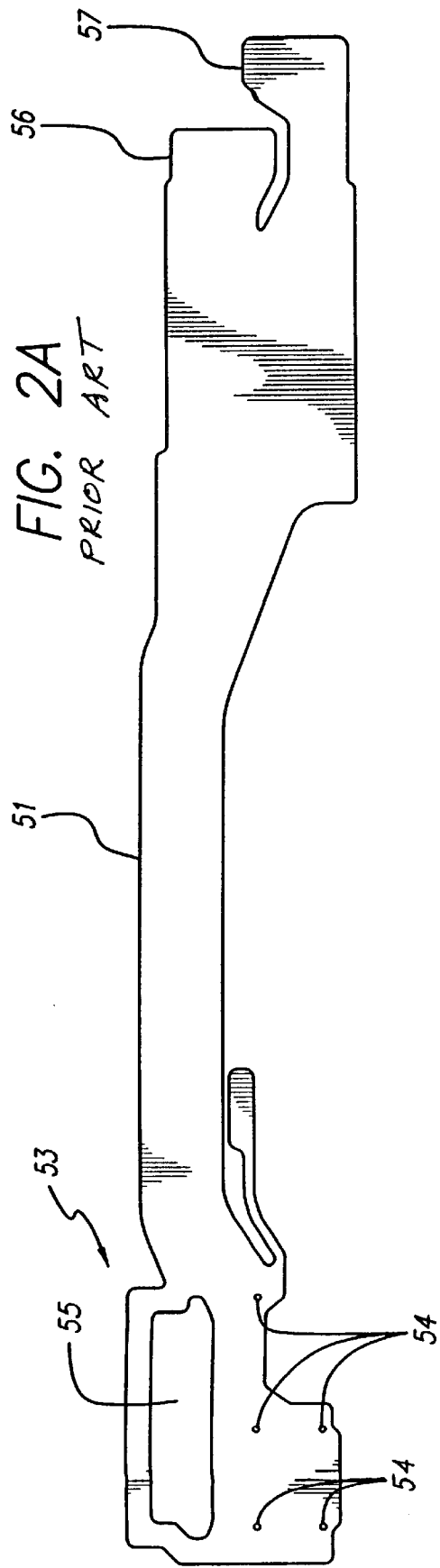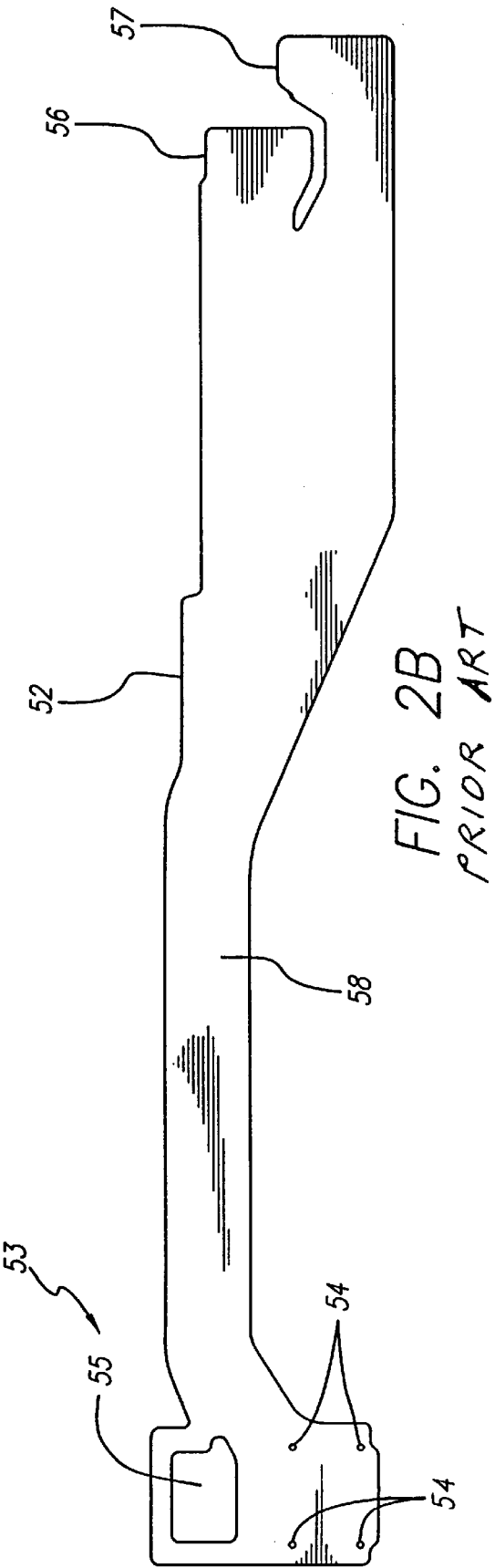

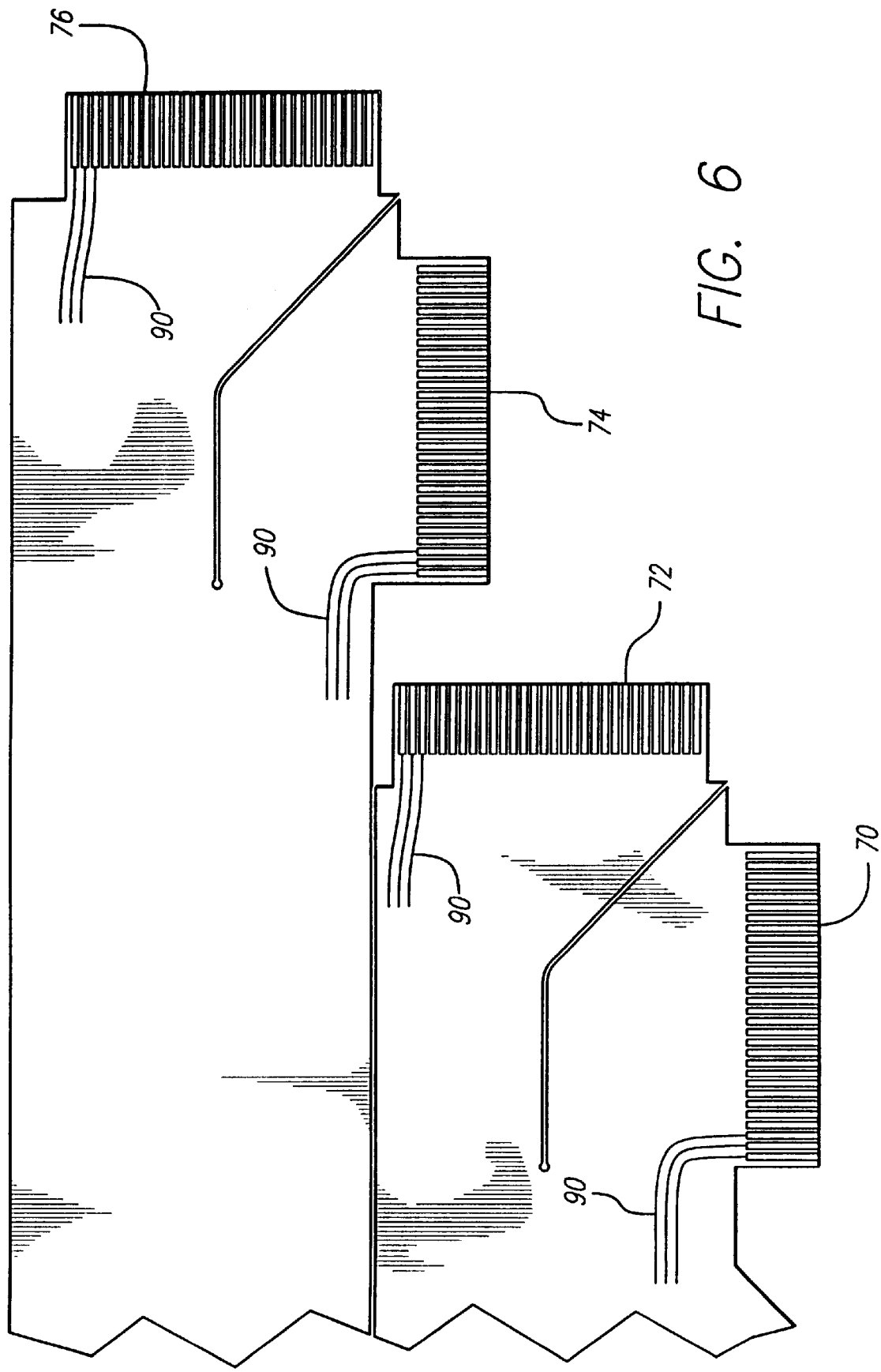

Z-FOLD PRINTHEAD CARRIAGE TRAILING CABLE FOR OPTIMIZED PANELIZATION

CROSS REFERENCE TO RELATED APPLICATION, IF ANY

None.

FIELD OF THE INVENTION

The present invention relates to the art of computer driven printers, particularly color ink jet printers. Printers of this type have a printhead carriage which is mounted for reciprocal movement on the printer in a direction orthogonal to the direction of movement of the paper or other medium on which printing is to take place through the printer. The printer carriage of a color printer typically has a black ink and one or more color thermal ink jet printheads removably mounted thereon.

Provision must be made for transmitting printhead control signals and printhead position data to and from the moveable carriage. Flexible cables currently used for this purpose extend from a printed circuit board mounted in a stationary position on the printer to the printhead carriage and transmit de-multiplexed signals to the carriage, the de-multiplexing circuitry being positioned on the printed circuit board. Since a large number of individual conductors are required in the trailing cable when de-multiplexed signals are to be conducted thereby, the currently used de-multiplexed signal transmitting trailing cables comprise two separate superimposed layers which respectively transmit de-multiplexed signals to the black ink jet printhead and to the color ink jet printhead. In order to connect the various conductors of the two layers to the printed circuit board, four separate cable connectors are employed thus requiring the two superimposed layers of the cable each to be split at the PCB connection end into two separate spaced parallel sections. Fabrication of these trailing cables for transmitting de-multiplexed signals to the carriage is extremely expensive due to the large number of conductors required (typically 120) and the amount of unusable areas on a standard rectangular circuit fabrication layout.

Since multiple trailing cable units are fabricated on a single panel, persons skilled in the art are constantly in search of more efficient panelization configurations so that more units can be fabricated on the same panel with resultant cost savings which can be extremely significant.

The present invention therefore provides an insulated substantially flat multi-conductor flexible printhead carriage trailing cable fabricated as a unit for conducting demultiplexed electrical printhead control signals to inkjet printheads mounted on a moveable carriage, said unit comprising:

a) a carriage end for attachment to a relatively rigid printhead carriage;

b) a connector end for connecting said unit to a remote location from which demultiplexed printhead control signals are transmitted;

c) an elongated trailing cable having a substantially straight flexible section between said carriage end and said connector end; and d) a plurality of insulated electrical conductors extending in said trailing cable from said connector end to said carriage end, some conductors terminating in exposed printhead contacts arranged in a pattern on a surface of said carriage end, said trailing cable having a longitudinally extending cut in said substantially straight section therein to define two parallel trailing cable sections and said carriage end having two fold lines therein which each extend parallel to said cut, said fold lines being positioned such that said carriage end may be folded on said lines to superimpose said trailing cable sections on each other.

BRIEF DESCRIPTION OF THE DRAWINGS

FIGS. 2a and 2b are flat layouts of the separate layers of a prior art carriage trailing cable which are then superimposed for transmitting de-multiplexed printhead control signals to a printhead carriage.

FIG. 6 is a plan view to an enlarged scale showing the connector ends of the trailing cable.

DESCRIPTION OF THE PREFERRED EMBODIMENT

Figure 1:
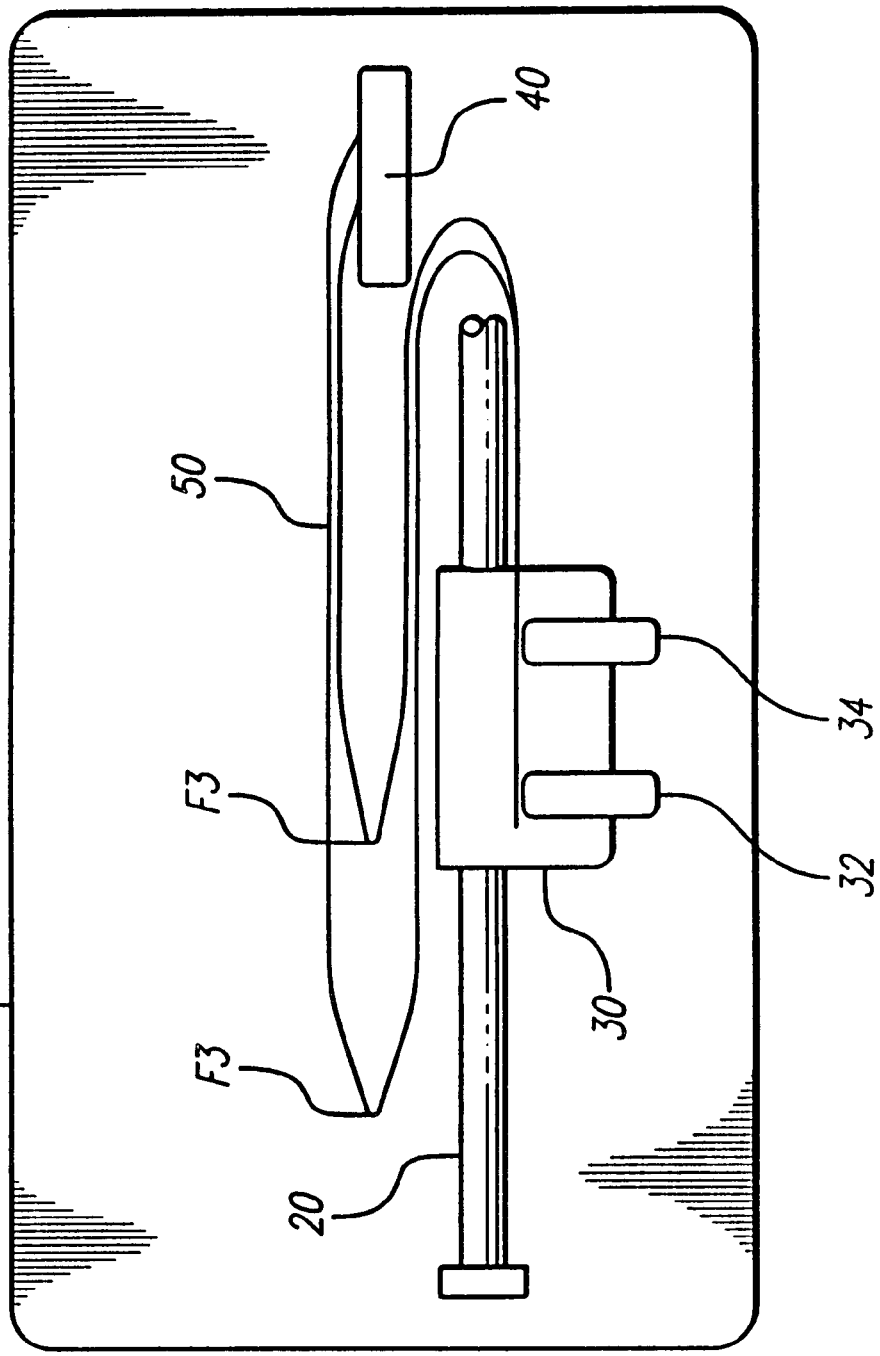
FIG. 1 is a schematic plan view of an inkjet printer carriage and flexible electric trailing cable.

The schematic plan view of FIG. 1 shows a desk top inkjet printer 10 having a transversely extending carriage support rod or rods 20 on which a carriage 30 is mounted for back and forth movement transversely of the printer 10. One or more removable printheads 32, 34 are mounted on the carriage 30 and eject ink downwardly onto the media on which printing is to take place. A flexible multi-conductor trailing cable 50 is used to conduct demultiplexed electrical printhead control signals from a stationary location on the printer such as a printed circuit board 40. The preferred cable unit embodiment uses 120 conductors in the cable for control of two printheads and an optical position decoder which enables determination of the precise position of the carriage.

FIGS. 2a and 2b show the layout of one form of trailing cable presently used by the assignee of the present invention discussed in the above Background of the Invention. The cable comprises a back layer 51 (FIG. 2a) for connection to a black ink printhead and a top layer 52 (FIG. 2b) for connecting to a color inkjet printhead, each layer having 60 conductors, the layers being separately manufactured and then layer 51 and layer 52 are superimposed when installed in a printer. Each layer has a carriage end section 53 with carriage mounting pin receiving holes 54 and an aperture 55 for receiving printhead connecting latches. The aperture in the back layer 51 is large enough to receive two printhead connecting latches and the aperture of the front layer 52 is sized to receive one latch. The superimposed back and top layers of the cable each have a connector end at the right as seen in FIGS. 2a and 2b which is split into two spaced connector portions 56, 57 each comprising 30 conductors, the trailing length portion 58 of the cable layers is substantially narrower (in the vertical direction as seen in FIGS. 2a and 2b) than the carriage connection end 53 and the spaced PCB connecting end portions 56, 57.

The current flex cable fabrication yields four back layers per panel. The top layer fabrication yields six top layers per fabricated panel. Accordingly, the total cost of the prior art flex circuit is $\frac{1}{4}^{th}+\frac{1}{6}^{th}=\frac{5}{12}^{th}$ (0.42) of a fabrication panel. The preferred embodiment of the trailing cable unit disclosed below may be fabricated six to a panel (0.17). The estimated savings by use of the present invention therefore is 0.42–0.17=0.258 of a panel—i.e. a significant reduction in cost of manufacturer.

Figure 3:
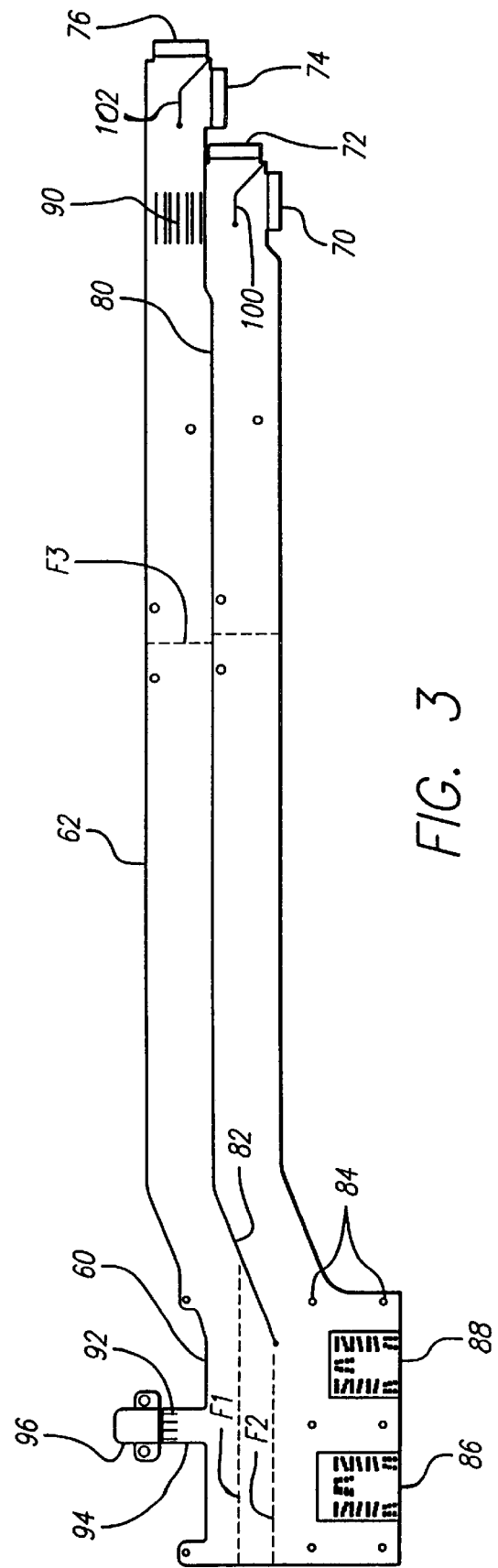
FIG. 3 is a plan view of Z-fold trailing cable.

In FIG. 3 the cable unit of the present invention is shown as a fabricated unit comprised of carriage end 60 of generally rectangular configuration and an integrally formed elongated trailing cable 62 which terminates in four orthogonally related connectors 70, 72, 74, 76 which attach the cable to a printed circuit board at a location remote from the moveable printhead carriage. The major length of the elongated trailing cable is a substantially straight flexible section which is in turn divided into two parallel sections by a longitudinally extending central cut 80. The carriage end 60 of the unit includes two parallel fold lines F1, F2 therein which each extend parallel to the major length of the cut 80 in the trailing cable, the cut 80 terminating just past the lower one F1 (as seen in FIG. 3) of the two fold lines. Preferably, a short extent 82 of the trailing cable which is angularly related to the elongated section of the trailing cable 62 joins the elongated trailing cable to the side edge of the carriage connector end 60. The elongated cut 80 and fold lines F1, F2 configured as shown permit the carriage connector end 60 to be reshaped into a Z-fold configuration as the two parallel parts of the elongated trailing cable are superimposed on each other. A plurality of apertures 84 are placed in selected locations in the carriage end 60 to receive protruding pins which extend from the carriage to properly position the carriage end 60 on the printhead carriage.

Also shown on the carriage end 60 are two spaced groups 86, 88 of exposed printhead contacts for respectively connecting to a black and to a color inkjet printhead. A plurality of electrical conductors 90 extend from the connectors 70, 72, 74, 76 shown at the right end of the unit through the two parallel trailing cable sections to the carriage end 60, some of the conductors from the upper trailing cable section being attached to the exposed contacts in the left hand group 86 of printhead contacts and conductors from the lower trailing cable section extending to the contacts of the right hand group 88 intended for connection to the color printhead. Four electrical conductors 92 extend upwardly from the carriage end through a rectangular tab 94 which is foldable over an upper edge of the printhead carriage to electrically connect the trailing cable unit to an optical carriage position encoder 96 which is soldered to the tab but itself is not part of the present invention.

Angled cut lines 100, 102 located as shown at the connector end of the trailing cable unit divide the upper and lower trailing cable sections into a total of four separate end sections each terminated by a 30 conductor electrical connector 70, 72, 74, 76. Accordingly, 30 parallel electrical conductor lines 90 (not shown for clarity) extend from each connector 70, 72, 74, 76 through the elongated and angularly related portions of the flexible trailing cable 62, some conductors 92 being routed through the tab 94 for connection to the optical position decoder 96 and other conductors 90 being routed directly to terminate in exposed printhead contacts arranged in the two groups 86, 88 shown. The configuration shown allows optimized electrical conductor trace routing through the carriage end 60 to the printhead contacts without redundant material from the two separate cable sections.

Figure 4:
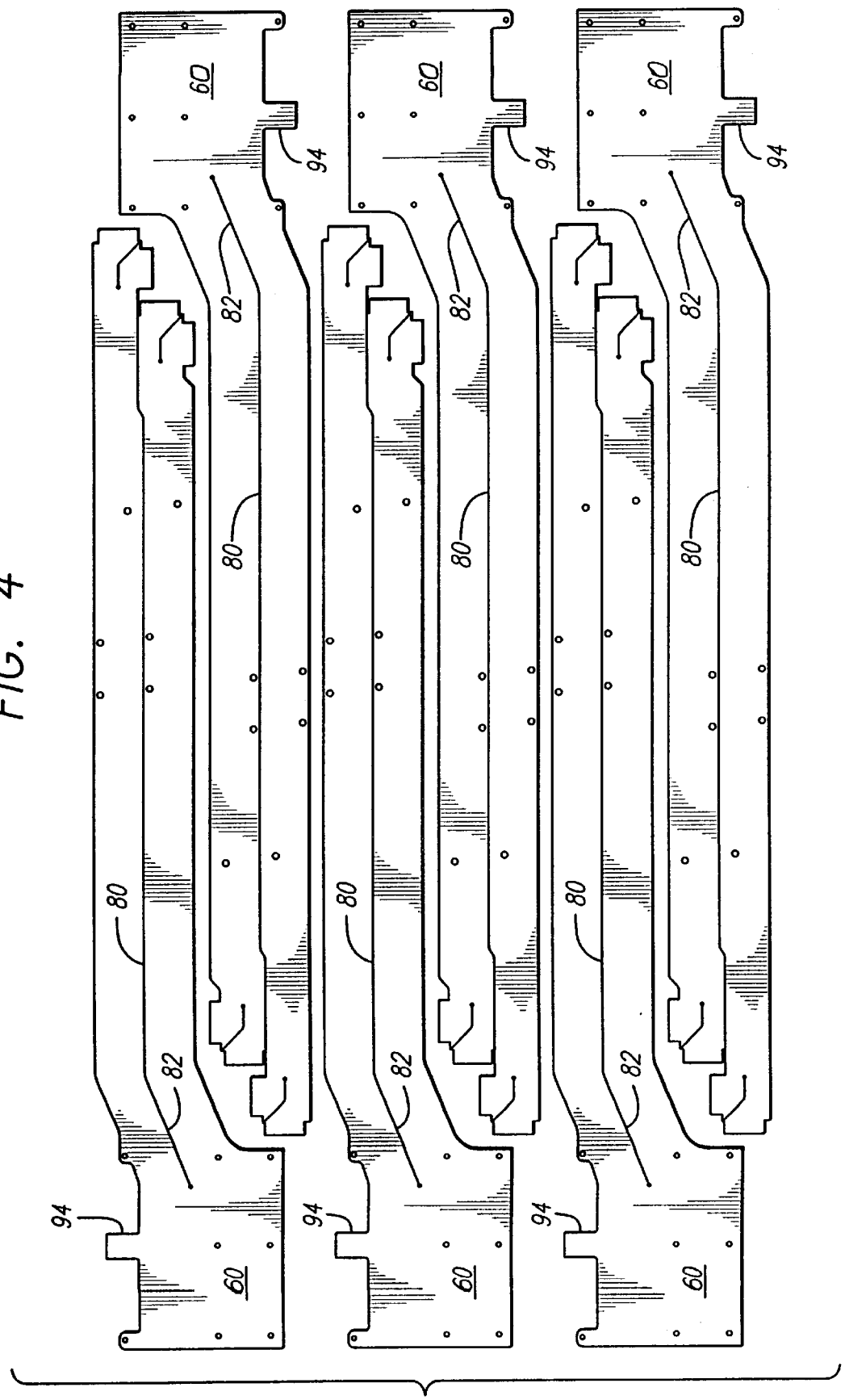
FIG. 4 is a plan view of a fabrication layout of a plurality of trailing cables.
Figure 5:
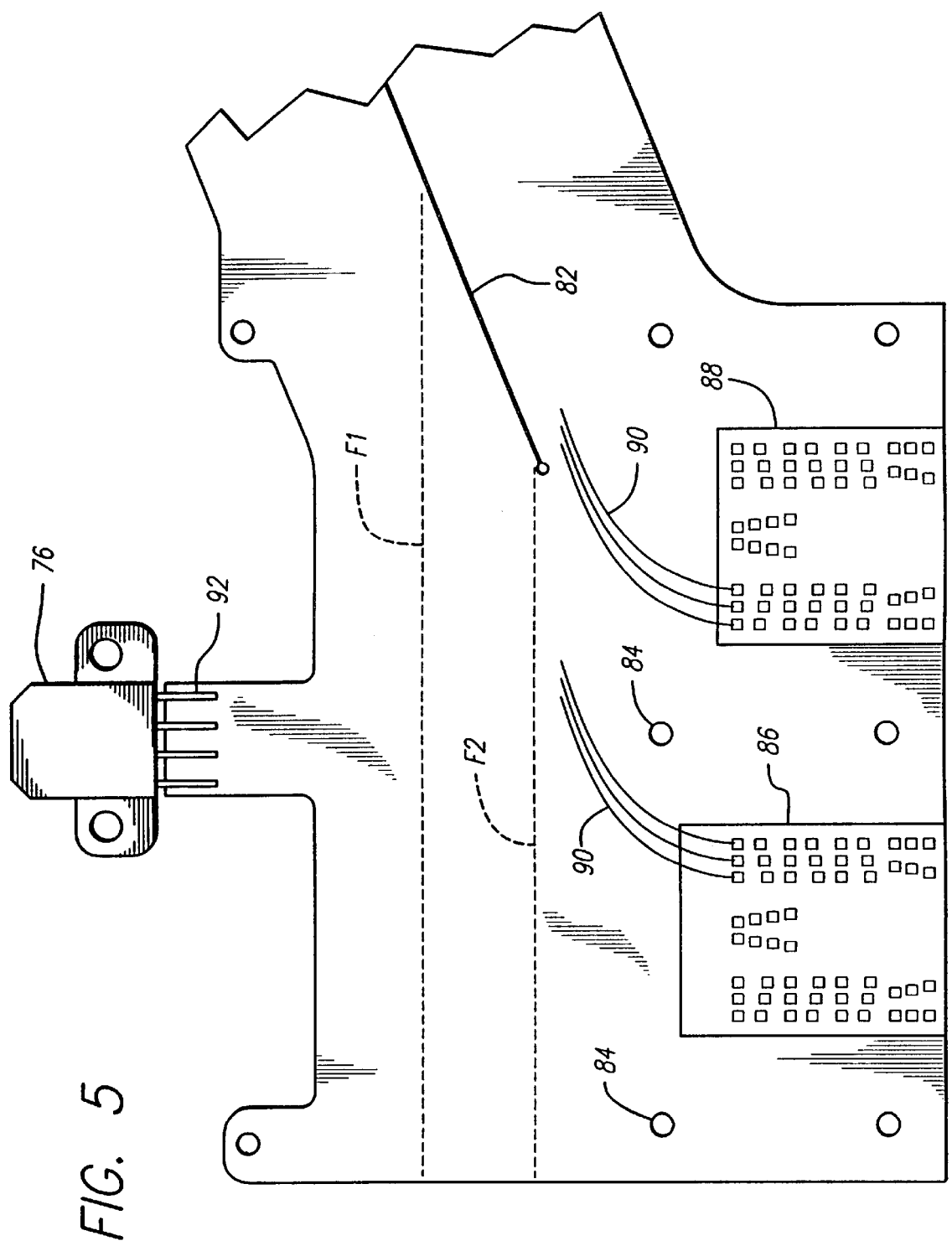
FIG. 5 is a plan view to an enlarged scale showing the carriage connection end and printhead contacts on the trailing cable.

A transverse fold line F3 (FIGS. 1 and 3) as shown in the elongated trailing cable sections is a preferred feature which permits the trailing cable 62 to be creased at an angle if necessary to clear conflicting geometry in the printer while retaining optimized geometry for efficient fabrication of a number of identical cable units in a single panel (6 units as seen in FIG. 4). The orthogonal arrangement of the connectors 70, 72, 74, 76 on the ends of the trailing cable also is designed for efficiency in fabrication allowing use of the least of amount of material which results in the best packing factor per fabrication panel. The cuts 100, 102 between the orthogonally related connectors 70, 72, 74, 76 allow the connectors to be independently manipulated as they are inserted into mating connectors in the printed circuit board at a location remote from the carriage.

Persons skilled in the art will appreciate that various modifications of the preferred embodiment described above can be made and, for this reason, the intended scope of protection is defined by the claims which follow.

What is claimed is:

1. An insulated flat multi-conductor flexible printhead carriage trailing cable fabricated as a unit for conducting demultiplexed electrical printhead control signals to inkjet printheads mounted on a moveable carriage, said unit comprising:

a) a carriage end for attachment to a printhead carriage;

b) a connector end for connecting said unit to a remote location from which demultiplexed printhead control signals are transmitted;

c) an elongated trailing cable having a straight flexible section between said carriage end and said connector end; and d) a plurality of insulated electrical conductors extending in said trailing cable from said connector end to said carriage end, some of said conductors terminating in exposed printhead contacts arranged in a pattern on a surface of said carriage end, said trailing cable having a longitudinally extending cut in said straight flexible section therein to define two parallel trailing cable sections and said carriage end having two fold lines therein which each extend parallel to said cut, said fold lines being positioned such that said carriage end may be folded on said lines to superimpose said trailing cable sections on each other.

2. The trailing cable unit of claim 1, wherein said cut is centrally located in said trailing cable so that said trailing cable sections are halves.

3. The trailing cable unit of claim 1, wherein said trailing cable sections each have a cut therein to define four ends, said ends each containing some of said electrical conductors and terminating in a connector.

4. The trailing cable unit of claim 3, wherein said trailing cable sections each terminate in two of said connectors that are orthogonally related.

5. The trailing cable unit of claim 4, wherein two of said connectors are perpendicular to said elongated trailing cable sections and two of said connectors are parallel to said elongated trailing cable sections, one of said connectors being on the cut side of one of said sections and one of said connectors being on an uncut side of the other of said sections.

6. The trailing cable unit of claim 5, wherein said connectors each include 30 conductors.

7. The trailing cable unit of claim 1, wherein said trailing cable sections include a first extent and a second extent, said first extent being shorter than and angularly related to said second extent of said two parallel trailing cable sections, said cut extending in said first extent and terminating proximate one of said fold lines.

8. The trailing cable unit of claim 7, wherein said carriage end is generally rectangular and said first extent connects said second extent of said two parallel cable sections to a side of said carriage end.

9. The trailing cable unit of claim 8, wherein said printhead contacts are arranged in two spaced groups and electrical conductors from one trailing cable section terminating in contacts of one of said groups and electrical conductors in the other trailing cable section terminating in contacts of the other of said groups.

10. The trailing cable unit of claim 9, further comprising an integrally formed tab on said carriage end, said tab having electrical conductors therein for connecting said unit to an optical position decoder, said tab extending from an edge of said carriage end and being foldable to extend on the side of said carriage end opposite said exposed printhead contacts.

11. The trailing cable unit of claim 10, further comprising a fold line extending transversely of said elongated trailing cable section.

12. The trailing cable unit of claim 11, further comprising a plurality of positioning apertures in said carriage end for receiving positioning pins on a printhead carriage.

\* \* \* \* \*